United States Patent
Mettifogo

[11] Patent Number: 5,964,953
[45] Date of Patent: Oct. 12, 1999

[54] POST-ETCHING ALKALINE TREATMENT PROCESS

[75] Inventor: Gianpaolo Mettifogo, Novara, Italy

[73] Assignee: MEMC Electronics Materials, Inc., St. Peters, Mo.

[21] Appl. No.: 09/084,565

[22] Filed: May 26, 1998

[51] Int. Cl.[6] .............. C30C 23/00; B08B 6/00; B08B 7/00

[52] U.S. Cl. .............. 134/2; 134/1.3; 134/33; 438/691; 438/692; 438/959

[58] Field of Search ............... 134/2, 3, 26, 1.3, 134/636.1; 51/309; 216/52, 88; 438/690, 691, 692, 626, 959; 156/643, 645

[56] References Cited

U.S. PATENT DOCUMENTS

| | | | |
|---|---|---|---|
| 4,156,619 | 5/1979 | Griesshammer | 132/2 |
| 4,944,836 | 7/1990 | Beyer et al. | 438/633 |
| 4,964,919 | 10/1990 | Payne | 134/2 |
| 5,049,200 | 9/1991 | Brunner et al. | 134/2 |
| 5,078,801 | 1/1992 | Malik | 134/29 |
| 5,176,756 | 1/1993 | Nakashima et al. | 134/2 |
| 5,277,702 | 1/1994 | Thibault et al. | 51/309 |
| 5,308,400 | 5/1994 | Chen | 134/2 |
| 5,389,194 | 2/1995 | Rostoker et al. | 156/636 |
| 5,397,397 | 3/1995 | Awad | 134/1 |
| 5,464,480 | 11/1995 | Matthews | 134/1.3 |
| 5,470,393 | 11/1995 | Fukazawa | 134/3 |
| 5,478,436 | 12/1995 | Winebarger et al. | 438/693 |
| 5,498,293 | 3/1996 | Ilardi et al. | 134/3 |
| 5,509,970 | 4/1996 | Shiramizu | 134/3 |
| 5,527,370 | 6/1996 | Kubo et al. | 51/309 |
| 5,560,857 | 10/1996 | Sakon et al. | 510/175 |
| 5,593,505 | 1/1997 | Erk et al. | 134/1.3 |
| 5,693,239 | 12/1997 | Wang et al. | 216/88 |
| 5,773,360 | 6/1998 | Chang et al. | 438/626 |

*Primary Examiner*—Jill Warden
*Assistant Examiner*—Yolanda E. Wilkins
*Attorney, Agent, or Firm*—Senniger, Powers, Leavitt & Roedel

[57] ABSTRACT

The present invention is directed to a process for removing aluminum contamination from the surface of an etched semiconductor wafer. The process is carried out by first lapping a semiconductor wafer in a lapping slurry containing aluminum, etching the wafer, and finally immersing the wafer in an aqueous bath, the bath comprising an alkaline component and a surfactant.

18 Claims, 1 Drawing Sheet

POST-ETCHING ALKALINE TREATMENT PROCESS

BACKGROUND OF THE INVENTION

The present invention generally relates to a process for cleaning semiconductor wafers. More particularly, the present invention relates to a process for removing aluminum contamination that may be present on the surface of single crystal semiconductor wafers after the wafers have been etched.

Semiconductor wafers used in the fabrication of integrated circuits are produced by slicing thin wafers from a single crystal silicon ingot. After slicing, the wafers undergo a lapping process to give them a substantially uniform thickness. The wafers are then etched to remove damage and produce a smooth surface. The final step in a conventional semiconductor wafer shaping process is a polishing step to produce a highly reflective and damage-free surface on at least one face of the wafer. It is upon this polished face that integrated circuit fabrication takes place.

Following the lapping step the wafers must typically be cleaned to remove such things as lapping grit (e.g., alumina), organic residues, metallic contaminants, and other types of particulate impurities. If the cleaning processes are not effective, the surfaces of the wafer will be contaminated, or "stained," with these impurities. When integrated circuits are fabricated on a wafer surface stained with these impurities, the quality and performance of these circuits may be greatly diminished. To ensure high quality and performance, the wafers are typically inspected for stains by visually examining the wafers while under either bright light or fluorescent light illumination.

The contamination that stains semiconductor wafers typically originates from one of the wafer production steps. For example, in the lapping operation, the lapping grit comprises a large amount of aluminum oxide (alumina). The hardness and particle shape of the alumina make it particularly suited for the lapping application. A consequence of using alumina, however, is that aluminum contamination (in both ionic and particulate form) may adhere to the surface of the wafer. Furthermore, because the wafer is extremely rough after the lapping operation, aluminum contamination may become trapped in crevices on the surface of the wafer. Subsequent operations, such as chemical etching or cleaning processes, may not sufficiently remove this contamination. Furthermore, the use of heat in any of these subsequent operations amplifies the aluminum contamination problem by causing the particles to more strongly adhere to the surface of the wafer. The polishing operation may lessen the aluminum contamination on the wafer by removing several microns of the wafer surface, but the unpolished backside of the wafer remains contaminated. Failure to remove this backside contamination may result in staining that, in turn, could cause diminished performance in the final product.

Numerous processes have heretofore been proposed for reducing or removing the aluminum contamination that adheres to the surfaces of a silicon wafer after the wafer has been lapped. In general, however, these processes are not preferred because they fail to both cost-effectively and efficiently remove contaminants in an amount which is sufficient to prevent a reduction in integrated circuit performance and quality.

For example, it has been disclosed that directing ultrasonic energy through a cleaning bath effectively reduces the particulate concentration on the surface of a wafer (See, e.g., Erk et al., U.S. Pat. No. 5,593,505). Because of the expense involved with the use of ultrasonic energy, however, this type of process increases the cost of removing aluminum contamination from the wafer. Further, prolonged exposure to ultrasonic energy may result in damage to the crystal lattice of the wafer.

Another cleaning technique which has been used to remove aluminum contamination employs an oxidizing cleaning solution (e.g., SC-1, a solution comprising ammonium hydroxide, hydrogen peroxide, and water in a 1:1:5 ratio). Generally, this technique is not preferred because it makes the surface of the wafer hydrophilic (e.g. oxygen terminated). Aluminum oxide is known to react with the wafer surface when it is in this state, forming silicon-aluminum oxide. When the aluminum and silicon form this stable phase, it is extremely difficult to remove the aluminum from the surface of the wafer.

Thus, a need continues to exist for a process which inexpensively and efficiently removes aluminum contamination from the surface of an etched silicon wafer which does not require the use of ultrasonic energy.

SUMMARY OF THE INVENTION

Among the objects of the present invention, therefore, are the provision of a process which removes aluminum contamination from the surface of a semiconductor wafer which does not require the use of ultrasonic energy; the provision of a process which removes aluminum contamination from the surface of a semiconductor wafer after the wafer has been etched; and the provision of a process which removes aluminum contamination from the surface of a semiconductor wafer inexpensively and efficiently.

Briefly, therefore, the present invention is directed to a process for removing aluminum contamination from the surface of an etched semiconductor wafer. The process is carried out by first lapping a semiconductor wafer in a lapping slurry containing aluminum, etching the wafer, and finally immersing the wafer in an aqueous bath, the bath comprising an alkaline component and a surfactant.

Other objects and features of this invention will be in part apparent and in part pointed out hereinafter.

DETAILED DESCRIPTION OF THE PREFERRED EMBODIMENTS

Figure 1:
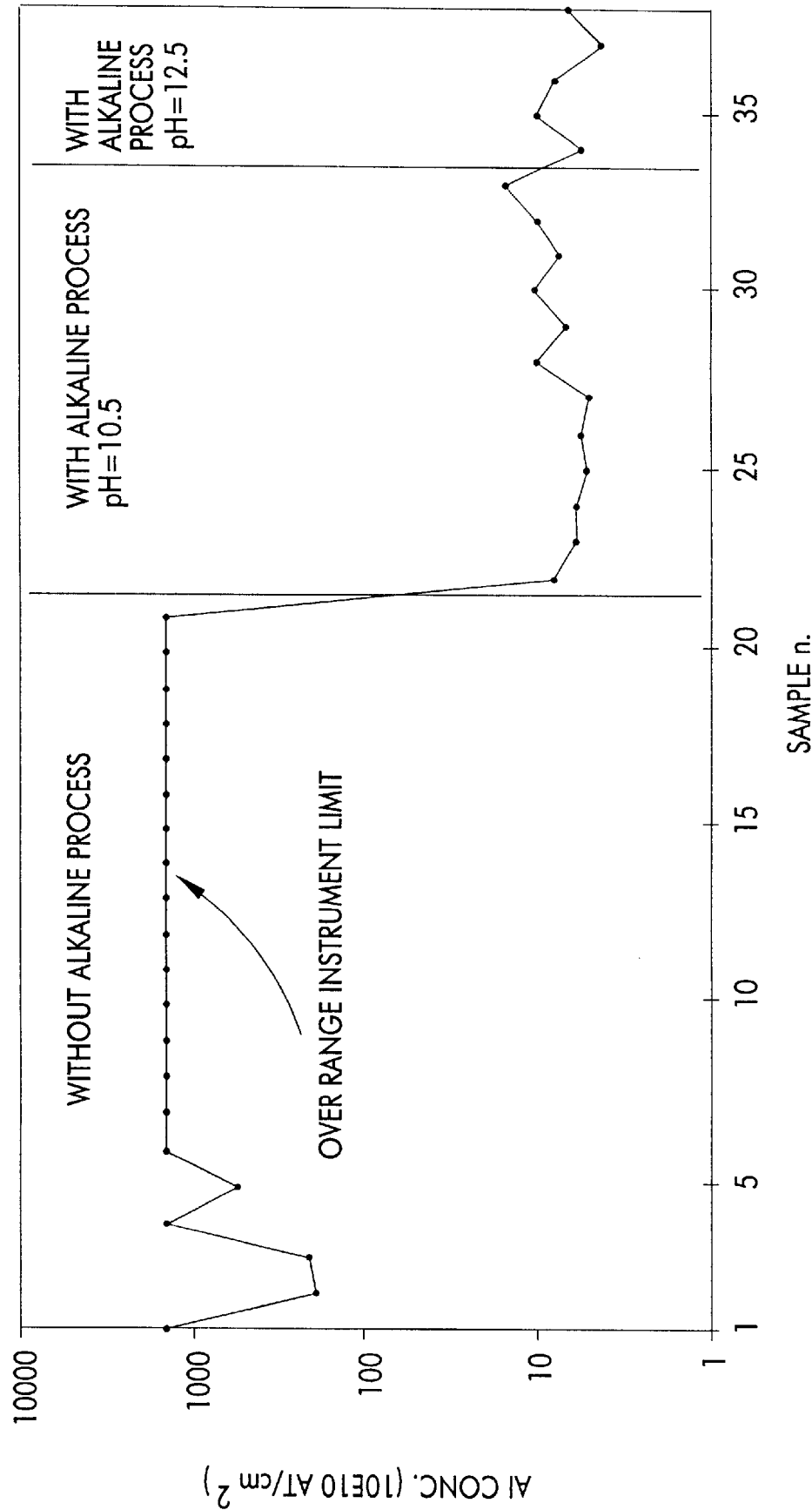
FIG. 1 is a graph depicting the aluminum contamination after etching with and without alkaline process.

After a silicon wafer is removed from the lapping operation, lapping slurry remains on the wafer surface. Among other things, this lapping slurry contains aluminum oxide (e.g. alumina) which may adhere to the surface of the wafer. In accordance with the process of the present invention, this aluminum contamination is removed from the surface of a silicon wafer, after the wafer has been etched, by immersing the wafer in an aqueous cleaning solution comprising an alkaline component and a surfactant.

Without being held to a particular theory, it is believed that the ability of the alkaline bath to remove aluminum contamination from the semiconductor wafer is partly dependent upon the presence of silicon oxide on the wafer surface. Experience has shown that when silicon oxide is not present on the wafer surface (i.e. when the surface of the wafer is hydrophobic, or hydrogen terminated), aluminum contamination is more readily removed. It is believed that aluminum oxide forms a stable phase with silicon oxide when those two substances are in contact, regardless of the pH value (e.g., $(Al_2O_3)\cdot(SiO_2)_x$). Thus, if silicon oxide is not present on the wafer surface, aluminum oxide cannot form a stable phase, facilitating the removal of aluminum contamination.

The following reaction sequence illustrates how an alkaline bath without an oxidizing agent results in a wafer with a hydrophobic surface (i.e. with little or no oxygen termination):

I $(Si_3Si-H)_{surf} + OH^- \rightarrow (Si_3SiO)_{surf}^{-+H}{}_2$,
II $(Si_3SiO)_{surf}^{-+3}OH^- \rightarrow 3(Si-H)_{surf} + SiO_4^{4-}$.

In reaction I, the hydroxyl group acts as an oxidizing agent, resulting in a wafer with a hydrophilic surface (oxygen terminated). In reaction II, the hydroxyl group acts as a stripping agent, resulting in a wafer with a hydrophobic surface state (hydrogen terminated). The faster step, therefore, determines the surface state of the wafer. In the process of the present invention, reaction II proceeds at a faster rate than reaction I, thereby resulting in a wafer with a hydrophobic surface state. As discussed above, this surface state facilitates the removal of aluminum contamination from the surface of the wafer. Alternatively, where oxidation chemistry is used (i.e. an SC-1 bath), reaction I is the faster step, thereby resulting in a wafer with a hydrophilic surface state and hindering the removal of aluminum contamination.

In a preferred embodiment of the present invention, a thin wafer is sliced from a single crystal silicon ingot. The wafer is then lapped by contacting the wafer with a lapping slurry, giving the wafer a substantially uniform thickness. Among other things, this lapping slurry contains lapping grit (aluminum oxide) which adheres to the surface of the wafer.

The lapped wafer is then etched by a process commonly known in the art, removing damage on the surface of the wafer and producing a smooth wafer surface. It is preferred that an acidic etchant be utilized in the etching process. Typical acidic etchants include acetic acid, nitric acid and fluoridic acid. Other types of etchants, however, may also be used, including alkaline etchants. Typical alkaline etchants include potassium hydroxide and sodium hydroxide. The temperature of the alkaline etchant solution is preferably greater than about 90° C. and the concentration of the alkaline component is preferably greater than about 40 percent.

Following the etching process, some aluminum contamination remains on the wafer surface. In accordance with the process of the present invention, the aluminum contamination is removed from the wafer surface by transferring the wafer from the etchant to an aqueous bath comprising an alkaline component and a surfactant. It is preferred that the wafer not be allowed to dry before being immersed in the alkaline bath of the present invention. Without being held to a particular theory, it is believed that allowing the wafers to dry after the etching process, but before immersing them in the alkaline bath, causes the aluminum contamination to more strongly adhere to the wafer surface.

The residence time of the wafer within the alkaline bath typically ranges from about 2 to about 4 minutes. The residence time is strongly dependent, however, upon the level of aluminum contamination on the wafer to be processed. Resistors, or some other heating element common in the art, are preferably attached to the alkaline bath so that the temperature of the bath can be maintained within the range of about 50° C. to about 65° C. More preferably the temperature ranges from about 55° C. to about 65° C. These temperature ranges are significant because when the temperature of the alkaline bath is between 50° C. and 65° C., a slight etching of the surface of the wafer occurs. By slightly undercutting the surface of the wafer, the alkaline bath removes aluminum contamination located in crevices and elsewhere on the surface of the wafer. It is preferable, however, not to allow the temperature of the alkaline bath to exceed 65° C. because this may cause the alkaline reaction to proceed too quickly and too strongly, producing areas of preferential etching.

The pH of the alkaline bath is significant because aluminum is known to dissolve in solutions with relatively high pH values. Thus, the pH of the alkaline bath typically ranges from about 10 to about 13. Preferably, however, the pH of the alkaline bath is about 11 to about 12.

The desired pH can be maintained by choosing a suitable alkaline component. Suitable alkaline components include potassium hydroxide (KOH), sodium hydroxide (NaOH), and ammonium hydroxide ($NH_4OH$). Any of these alkaline solutions may be used in combination with surfactants that are commonly known in the art to be suitable for use as a wafer cleaning agent tinder alkaline conditions (e.g., anionic surfactants, non-ionic surfactants, or surfactants with both anionic and non-ionic components). The surfactant is preferably Vector HTC (commercially available from Intersurface Dynamics of Bethel, Conn.).

In another preferred embodiment, the alkaline bath comprises potassium hydroxide at a concentration typically ranging from about 0.5 to about 5 percent by weight. Preferably, the concentration ranges from about 0.5 to about 3 percent by weight and, more preferably, about 1 percent by weight. The alkaline bath also contains a surfactant which is, preferably, Vector HTC (available from Intersurface Dynamics of Bethel, Conn.). It is preferred that the concentration of the surfactant in the bath ranges from about 1 to about 5 percent by volume, and more preferably from about 1 to about 2 percent by volume.

The purpose of adding surfactant to the alkaline bath of the present invention is to prevent staining on the surface of the wafer. It accomplishes this purpose by acting as a wetting agent. As shown in the reaction I, above, hydrogen gas evolves during the alkaline reaction. If the surface of the wafer is in a hydrophobic state, the hydrogen bubbles may adhere to the surface of the wafer. This may result in preferential etching at those sites, rendering the wafer defective. The surfactant component acts to reduce the surface tension of the aqueous solution on the wafer. Thus, by acting as a wetting agent, the surfactant keeps the surface of the wafer hydrophilic, thereby preventing hydrogen bubbles from adhering to the surface of the wafer.

Relatedly, if a surfactant is chosen that contains non-ionic components, it is important to ensure that the temperature of the alkaline bath does not exceed 65° C. If the temperature of the bath does rise above 65° C., micelles and foam may result, causing preferential etching and damage to the wafer surface.

Wafer cassettes are often used to process numerous wafers at one time. When a cassette is used, certain areas of the silicon wafer are in constant contact with the cassette. Even if the alkaline bath contains a surfactant, the areas on the wafer that come into contact with the cassette may become hydrophobic. Hydrophobicity at the contact points between the wafer and the cassette is particularly a concern where highly reflective materials are being processed. As shown in reaction I, above, hydrogen gas evolves during the alkaline reaction. These hydrogen bubbles may adhere to the hydrophobic areas on the wafer, causing preferential etching, and thus staining, on the surface of the wafer. To eliminate the hydrophobic areas, and the correspondent staining, it is preferred that wafers being processed in a.

wafer cassette be rotated while immersed in the alkaline bath. By rotating the wafers, no area of the wafer will be in constant contact with the wafer cassette, thereby ensuring that the entire surface of the wafer will remain free of damage from the hydrogen bubbles.

Increased removal of aluminum contamination from the wafer surface may be achieved by employing a half-immersion step as disclosed in U.S. Pat. No. 5,593,505 (Erk et al.). A gas-liquid interface is defined at the surface of the alkaline solution. The wafer is placed in the alkaline bath so that it is oriented in a generally upright position with at least part of the wafer in the liquid and below the gas-liquid interface. The wafer is simultaneously rotated in a reciprocating motion relative to the bath so that the entire surface of the wafer is repeatedly passed through the gas-liquid interface of the bath. The wafer can also be rotated as the level of the liquid in the bath is raised and lowered. This also results in the surface of the wafer being repeatedly passed through the gas-liquid interface. Finally, as yet another alternative, the wafer can be repeatedly immersed completely in the bath and then removed completely from the bath. The wafer is continuously rotated while the successive immersions occur. Again, this results in the surface of the wafer being repeatedly passed through the gas-liquid interface. In all of the above embodiments, at least a portion of the wafer is repeatedly passed through the gas-liquid interface.

In a further embodiment of the present invention, the alkaline bath is continuously filtered and recirculated. This feature aids in the removal of aluminum contamination from the alkaline solution and helps prevent the aluminum contamination from being redeposited on the wafer surface. Preferably, the recirculation system has a capacity of one bath turnover about every 2 minutes. To ensure that the filtering system sufficiently removes the aluminum contamination from the alkaline solution, it is preferred that the filter mesh range from about 0.1 to about 0.3 microns, and more preferably, about 0.2 microns.

Preferably, the wafer is rinsed after being removed from the alkaline bath. Rinsing the wafer with either DI water, heated DI water, or ozonated water beneficially removes organic residue left by the surfactant on the surface of the wafer. Of these rinses, ozonated water is preferred because of its powerful oxidizing characteristics. The concentration of ozone in the aqueous solution preferably ranges from about 2 to about 5 ppm and, more preferably, from about 3 to about 4 ppm.

The rinsing step is preferably carried out by using a robotic arm to transfer the wafers from the alkaline bath to a rinse tank constructed with polypropylene. Though it is preferred that an overflow bath be utilized, the wafer may be rinsed using a quick-dump-rinse or any other technique known in the art.

The present invention is illustrated by the following example which is merely for the purpose of illustration and is not to be regarded as limiting the scope of the invention or manner in which it may be practiced.

EXAMPLE

To determine the effectiveness of the process of the present invention, 38 samples of post-etched silicon wafers were analyzed for aluminum contamination. The first 21 samples of post-etched wafers were not treated by a cleaning process. The concentration of aluminum on the surface of the wafers in these samples is shown in Chart 1 below.

Subsequently, 12 samples were treated with an alkaline cleaning bath in accordance with the process of the present invention. A wafer cassette was used to transport the wafers. While still wet from the etching process, the wafers were immersed in a bath comprising an anionic surfactant for 4 minutes. The composition of the surfactant included KOH, thus, no additional KOH was added to the bath. Throughout the cleaning process, the wafers were rotated by means known in the art. The resultant pH of the bath was about 10.5. Furthermore, the bath was maintained at a temperature of about 65° C.

The wafers were then robotically transferred from the alkaline bath into an overflow rinse bath comprising water, where they resided for about 3 minutes. The temperature of the rinse bath was about 20° C. The resulting concentration of aluminum on the surface of the wafers is shown in Chart 1 below.

The final 5 samples of post-etched wafers were also treated with an alkaline cleaning bath, in accordance with the present invention. Again, a wafer cassette was used to transport the wafers. While still wet from the etching process, the wafers were immersed in a bath comprising potassium hydroxide and Vector HTC surfactant for 4 minutes. Throughout the cleaning process, the wafers were rotated by means known in the art. The concentration of the potassium hydroxide in the bath was about 0.5 percent and the concentration of surfactant in the bath was about 1 percent. The resultant pH of the bath was about 12.5. Furthermore, the bath was maintained at a temperature of about 65° C.

The wafers were then robotically transferred from the alkaline bath into an overflow rinse bath, comprising water, wherein the wafers resided for about 3 minutes. The temperature of the rinse bath was about 20° C. The resulting concentration of aluminum on the surface of the wafers is shown in FIG. 1.

As is readily apparent from FIG. 1, implementing the process of the present invention can dramatically decrease the level of aluminum contamination on the surface of a silicon wafer.

In view of the above, it will be seen that the several objects of the invention are achieved.

As various changes could be made in the above-described process without departing from the scope of the invention, it is intended that all matter contained in the above description be interpreted as illustrative and not in a limiting sense.

What is claimed is:

1. A process for removing aluminum contamination from the surface of a silicon wafer, the process comprising the sequential steps of lapping the silicon wafer using a lapping slurry which contains aluminum;

etching the lapped silicon wafer; and immersing the etched wafer in an aqueous bath, the bath comprising an alkaline component and a surfactant, and the bath having a pH value of at least about 10.

2. The process as set forth in claim 1 wherein the alkaline component is potassium hydroxide.

3. The process as set forth in claim 2 wherein the aqueous bath has a potassium hydroxide concentration ranging from about 0.5 to about 3 percent by weight.

4. The process as set forth in claim 1 wherein the aqueous bath has a surfactant concentration ranging from about 1 to about 2 percent by weight.

5. The process as set forth in claim 1 wherein the aqueous bath is heated to a temperature of about 55° C. to about 65° C.

6. The process as set forth in claim 1 wherein the aqueous bath has a pH value ranging from about 10.5 to about 12.5.

7. The process as set forth in claim 1 wherein the wafer is immersed in the aqueous bath for a period of time ranging from about 2 minutes to about 4 minutes.

8. The process as set forth in claim 1 wherein the wafer is kept wet before being immersed in the alkaline bath.

9. The process as set forth in claim 1 wherein after the wafer is removed from the alkaline bath, it is rinsed to remove organic residue that may be present on the wafer.

10. The process as set forth in claim 9 wherein the rinsing step comprises immersing the wafer in an aqueous bath comprising ozonated water.

11. The process as set forth in claim 10 wherein the rinse bath has an ozone concentration ranging from about 2 ppm to about 5 ppm.

12. The process as set forth in claim 1 wherein the wafer is rotated while immersed in the aqueous bath.

13. The process as set forth in claim 1 wherein the wafer is rotated such that at least a portion of the wafer repeatedly passes through a gas-liquid interface of the aqueous bath.

14. A process for removing aluminum contamination from the surface of a silicon wafer, the process comprising lapping the silicon wafer using a lapping slurry which contains aluminum;

etching the lapped silicon wafer;

immersing the etched wafer in an aqueous bath, the bath comprising an alkaline component and a surfactant, and the bath having a pH value of at least about 10 to remove aluminum contamination; and rinsing the treated wafer to remove organic residue that may be present on the wafer.

15. The process as set forth in claim 14 wherein the rinsing step comprises immersing the wafer in an aqueous bath comprising ozonated water.

16. The process as set forth in claim 15 wherein the rinse bath has an ozone concentration ranging from about 2 to about 5 ppm.

17. A process for removing aluminum contamination from the surface of a silicon wafer, the process comprising lapping the silicon wafer using a lapping slurry which contains aluminum;

etching the lapped silicon wafer;

immersing the etched wafer in an aqueous bath, the bath comprising an alkaline component and a surfactant, and the bath having a pH value of at least about 10 to remove aluminum contamination; and rotating the etched wafer while it is immersed in the aqueous bath.

18. The process as set forth in claim 17 wherein the wafer is rotated such that at least a portion of the wafer repeatedly passes through a gas-liquid interface of the aqueous bath.

* * * * *